United States Patent
Uehara

(10) Patent No.: US 8,632,894 B2
(45) Date of Patent: Jan. 21, 2014

(54) SUBSTRATE FOR ELECTRONIC DEVICE, METHOD FOR MANUFACTURING THE SUBSTRATE FOR ELECTRONIC DEVICE, ELECTRONIC DEVICE PROVIDED WITH THE SUBSTRATE FOR ELECTRONIC DEVICE, AND ELECTRONIC EQUIPMENT PROVIDED WITH THE ELECTRONIC DEVICE

(75) Inventor: Masamitsu Uehara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1465 days.

(21) Appl. No.: 11/922,780

(22) PCT Filed: Jun. 21, 2006

(86) PCT No.: PCT/JP2006/312451
§ 371 (c)(1),
(2), (4) Date: Mar. 20, 2008

(87) PCT Pub. No.: WO2006/137461
PCT Pub. Date: Dec. 28, 2006

(65) Prior Publication Data
US 2009/0136743 A1    May 28, 2009

(30) Foreign Application Priority Data
Jun. 22, 2005    (JP) .................................. 2005-181568

(51) Int. Cl.
| B32B 9/00 | (2006.01) |
| B32B 19/00 | (2006.01) |
| B05D 5/12 | (2006.01) |
| H01L 29/08 | (2006.01) |
| H01L 35/24 | (2006.01) |
| H01L 51/00 | (2006.01) |
| H01J 1/62 | (2006.01) |
| C08G 75/00 | (2006.01) |
| C08G 75/20 | (2006.01) |

(52) U.S. Cl.
USPC .............. 428/699; 257/40; 313/504; 427/58; 428/688; 428/689; 428/698; 528/384; 528/391

(58) Field of Classification Search
USPC ................. 428/688, 689, 690, 337, 698, 699; 257/40; 313/504; 427/58; 528/384, 391
See application file for complete search history.

(56) References Cited

U.S. PATENT DOCUMENTS 5,955,834 A     9/1999 Epstein et al.
7,297,415 B2 * 11/2007 Noguchi et al. .............. 428/690

(Continued)

FOREIGN PATENT DOCUMENTS

| JP | A 8-288066 | 11/1996 |
| JP | A 9-255774 | 9/1997 |

(Continued)

*Primary Examiner* — Jonathan Langman
(74) *Attorney, Agent, or Firm* — Oliff & Berridge, PLC

(57) ABSTRACT

A substrate for an electronic device having high carrier transport ability, a method for manufacturing a substrate for an electronic device which can manufacture such a substrate for an electronic device, an electronic device provided with the substrate for an electronic device and having improved properties, and electronic equipment having high reliability are provided. A substrate for an electronic device includes a light emitting layer (organic semiconductor layer), a cathode (inorganic layer), and an intermediate layer provided between the light emitting layer and the cathode so as to make contact with both of the light emitting layer and the cathode. The intermediate layer is constituted of a compound (1) represented by a general formula R—X—O—M as a main component thereof. In the general formula, the R is a hydrocarbon group, the X is any one of binding groups comprising a single bond, a carbonyl group and a sulfonyl group, and the M is any one of a hydrogen atom and a metal atom. Molecules of this compound (1) are oriented along a thickness direction of the intermediate layer in a state that each hydrocarbon group R is positioned on the side of the light emitting layer and each atom M is positioned on the side of the cathode.

16 Claims, 5 Drawing Sheets

(56) References Cited

U.S. PATENT DOCUMENTS

| | | | |
|---|---|---|---|
| 7,425,375 B2* | 9/2008 | Shirai et al. | 428/690 |
| 7,569,159 B2* | 8/2009 | Hammond et al. | 252/500 |
| 8,399,604 B2* | 3/2013 | Seshadri et al. | 528/391 |
| 2004/0018386 A1* | 1/2004 | Naito et al. | 428/690 |
| 2004/0219388 A1* | 11/2004 | Noguchi et al. | 428/690 |
| 2006/0175582 A1* | 8/2006 | Hammond et al. | 252/500 |
| 2008/0248313 A1* | 10/2008 | Seshadri et al. | 428/419 |

FOREIGN PATENT DOCUMENTS

| | | |
|---|---|---|
| JP | A 2001-267068 | 9/2001 |
| JP | A 2002-151269 | 5/2002 |
| JP | A 2002-515169 | 5/2002 |
| JP | A 2006-92809 | 4/2006 |
| WO | WO 2004095888 A1 * | 11/2004 |

* cited by examiner

SUBSTRATE FOR ELECTRONIC DEVICE, METHOD FOR MANUFACTURING THE SUBSTRATE FOR ELECTRONIC DEVICE, ELECTRONIC DEVICE PROVIDED WITH THE SUBSTRATE FOR ELECTRONIC DEVICE, AND ELECTRONIC EQUIPMENT PROVIDED WITH THE ELECTRONIC DEVICE

BACKGROUND

1. Technical Field

The present invention relates to a substrate for an electronic device, a method for manufacturing the substrate for an electronic device, an electronic device provided with the substrate for an electronic device, and electronic equipment provided with the electronic device.

2. Related Art

There is known an electronic device having a substrate for an electronic device in which an organic semiconductor layer and an inorganic layer are provided so as to make contact with each other. Examples of such an electronic device include an organic electroluminescence device (hereinafter, simply referred to as an "organic EL device") and an organic thin film transistor.

Among them, the organic EL device have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

At this time, in the case where a molecular structure of organic EL materials (light emitting layer materials) is a specific structure or an aggregation state of molecules of the organic EL materials is a specific state, the injected electrons cannot be combined with the injected holes immediately, and therefore the injected electrons and holes are retained for a certain period of time in a specific excitation state.

Therefore, in such a specific excitation state, total energy of the molecules increases only for an amount of excitation energy as compared to a ground state which is a normal state. Pairs of the electrons and the holes which are being retained in such a specific excitation state are referred to as exciter (exciton).

After a lapse of the certain period of time, when the exciter disintegrates and thereby the electrons are combined with the holes, the increased excitation energy is released to the outside of the organic EL device as heat and/or light.

The light is released in the vicinity of the light emitting layer. A quantity of the released light based on the excitation energy is affected by the molecular structure of the organic EL materials or the aggregation state of the molecules of the organic EL materials significantly.

In such an organic EL device, it has been known that a layered device structure, in which organic semiconductor layers formed of organic semiconductor materials having different carrier transport properties for carriers (electrons or holes) are provided between a light emitting layer and a cathode and/or an anode, is effective in obtaining high luminance.

In order to obtain high luminous efficiency in such an organic EL device having a structure in which a light emitting layer and an organic semiconductor layer are provided between an anode and a cathode, extensive researches and studies are conducted on molecular structures of organic EL materials and organic semiconductor materials to be used, aggregation states of molecules of these materials, a number of layers of the light emitting layer and the organic semiconductor layer, a laminated position thereof, and the like.

However, even in the organic EL devices modified as described above, characteristics such as luminous efficiency and the like are not so improved as to meet expectations in actuality (see JP-A H09-255774, for example).

Recently, the reason why such sufficient characteristics improvement cannot be obtained has been roughly known. Namely, in such organic EL devices, interaction between a constituent material of an inorganic layer (e.g., metallic material) and an organic semiconductor material of an organic semiconductor layer adjacent to the inorganic layer is larger than interaction between the organic semiconductor materials of the adjacent organic semiconductor layers.

Therefore, the organic semiconductor material and the inorganic material repel with each other, as a result of which, sufficient adhesion cannot be obtained between the organic semiconductor layer and the inorganic layer, so that transfer of the carriers is not carried out smoothly between the organic semiconductor layer and the inorganic layer.

In order to solve such a problem, JP-A 2002-151269 discloses that carrier transport ability can be improved by forming a hole injection layer constituted of metal complexes such as copper phthalocyanine as a main component thereof between an anode (inorganic layer) and a hole transport layer (organic semiconductor layer) using a vapor phase film formation method such as a vacuum deposition method or an ion beam method.

However, even in the case of JP-A 2002-151269, adhesion between the anode and the hole injection layer cannot be improved sufficiently. As a result, it is impossible to obtain improvement in properties of the organic EL device sufficiently.

In this regard, it is supposed that the same problem occurs in the organic thin film transistor.

SUMMARY

Accordingly, it is an object of the present invention to provide a substrate for an electronic device having high carrier transport ability, a method for manufacturing a substrate for an electronic device which can manufacture such a substrate for an electronic device, an electronic device provided with the substrate for an electronic device and having excellent properties, and electronic equipment provided with the electronic device and having high reliability.

The object is achieved by the present invention described below. In a first aspect of the present invention, there is provided a substrate for an electronic device. The substrate comprises an organic semiconductor layer, an inorganic layer, and an intermediate layer provided between the organic semiconductor layer and the inorganic layer so as to make contact with both of the organic semiconductor layer and the inorganic layer.

The intermediate layer is constituted of a compound represented by a general formula R—X—O-M (wherein, R is a hydrocarbon group, X is any one of binding groups comprising a single bond, a carbonyl group and a sulfonyl group, and M is any one of a hydrogen atom and a metal atom) as a main component thereof.

Molecules of the compound R—X—O-M are oriented along a thickness direction of the intermediate layer in a state that each hydrocarbon group R is positioned on the side of the organic semiconductor layer and each atom M is positioned on the side of the inorganic layer.

This makes it possible to transfer carriers from the inorganic layer to the organic semiconductor layer through the intermediate layer smoothly and therefore it is possible to obtain a substrate for an electronic device having high carrier transport ability.

In the substrate according to the present invention, it is preferred that the hydrocarbon group R is a saturated hydrocarbon group.

The saturated hydrocarbon group has only small bias of electron distribution in an electron cloud thereof. Therefore, by selecting the saturated hydrocarbon group as the hydrocarbon group R, affinity between a constituent material of the organic semiconductor layer and the hydrocarbon group R can be further improved.

In the substrate according to the present invention, it is preferred that the number of carbon atom(s) contained in the hydrocarbon group R is in the range of 1 to 30.

This makes it possible to improve affinity between the hydrocarbon group R and the constituent material of the organic semiconductor layer. Therefore, each hydrocarbon group R can be positioned on the side of the organic semiconductor layer more reliably.

In the substrate according to the present invention, it is preferred that the atom M is a metal atom, and the metal atom and an atom contained in a constituent material of the inorganic layer belong to a congener in a periodic table.

This makes it possible to improve affinity between the atom M and a constituent material of the inorganic layer. Therefore, it is possible to make adhesion between the intermediate layer and the inorganic layer more excellent.

In the substrate according to the present invention, it is preferred that the atom M is a metal atom which is one of an alkali metal and an alkali earth metal.

Each of the alkali metal and the alkali earth metal has a small work function. Therefore, by forming the intermediate layer using the compound represented by the general formula R—X—O-M having the above atom as the atom M so that a part of the compound R—X—O-M is penetrated into the inorganic layer, the inorganic layer can have a lower work function.

In the substrate according to the present invention, it is preferred that the atom M is Li, Na, K, Be, Mg, Sc, Zn or Ca.

Since each of these atoms has an especially small work function and is preferably used as the constituent material of the inorganic layer for transferring electrons, adhesion between the intermediate layer and the inorganic layer can be improved reliably and the work function of the inorganic layer can be reduced reliably.

In the substrate according to the present invention, it is preferred that the binding group X is the carbonyl group or the sulfonyl group.

By selecting the carbonyl group or the sulfonyl group as the binding group X, bias of electron distribution in an electron cloud of a portion of the compound represented by the general formula R—X—O-M other than the hydrocarbon group R can be made large.

This makes it possible to improve affinity between the portion of the compound R—X—O-M and the constituent material of the inorganic layer. Therefore, the molecules of the compound R—X—O-M can be oriented in a state that each atom M is positioned on the side of the inorganic layer reliably.

In the substrate according to the present invention, it is preferred that a part of the compound is penetrated into the organic semiconductor layer.

This makes it possible to further improve adhesion between the intermediate layer and the organic semiconductor layer. As a result, carriers can be transferred from the intermediate layer to the organic semiconductor layer more smoothly.

In the substrate according to the present invention, it is preferred that a part of the compound is penetrated into the inorganic layer.

This makes it possible to further improve adhesion between the intermediate layer and the inorganic layer. As a result, carriers can be transferred from the inorganic layer to the intermediate layer more smoothly.

In the substrate according to the present invention, it is preferred that an average thickness of the intermediate layer is 10 nm or less.

By setting the average thickness of the intermediate layer to a value within the above range, the intermediate layer can be formed relatively easily as a monomolecular film of the compound represented by the general formula R—X—O-M in which the molecules of the compound R—X—O-M are oriented in a state that each hydrocarbon group R is positioned on the side of the organic semiconductor layer and each atom M is positioned on the side of the inorganic layer.

In a second aspect of the present invention, there is provided a method for manufacturing a substrate for an electronic device. The substrate comprises an organic semiconductor layer, an inorganic layer, and an intermediate layer provided between the organic semiconductor layer and the inorganic layer so as to make contact with both of the organic semiconductor layer and the inorganic layer.

The method comprises forming the organic semiconductor layer having one surface, preparing a liquid material containing a compound represented by a general formula R—X—O-M (wherein, R is a hydrocarbon group, X is any one of binding groups comprising a single bond, a carbonyl group and a sulfonyl group, and M is any one of a hydrogen atom and a metal atom), applying the liquid material onto the one surface of the organic semiconductor layer so that molecules of the compound are oriented along a thickness direction of the organic semiconductor layer in a state that each hydrocarbon group R is positioned on the side of the organic semiconductor layer and each atom M is positioned on the opposite side of the organic semiconductor layer due to affinity of the hydrocarbon group R and a constituent material of the organic semiconductor layer, drying the liquid material to obtain the intermediate layer having one surface which makes contact with the organic semiconductor layer and the other surface which is opposite to the one surface, and forming the inorganic layer so as to make contact with the other surface of the intermediate layer.

This makes it possible to manufacture a substrate for an electronic device in which carriers can be transferred from the inorganic layer to the organic semiconductor layer through the intermediate layer smoothly, that is, a substrate for an electronic device having high carrier transport ability.

In the method according to the present invention, it is preferred that the liquid material contains a solvent or a dispersion medium in which the compound is dissolved or dispersed, the solvent or the dispersion medium being of the type that can dissolve or swell the organic semiconductor layer, and in the liquid material applying step, when the liquid material is applied onto the one surface of the organic semiconductor layer, a part of the compound is penetrated into the organic semiconductor layer by dissolving or swelling the vicinity of the one surface thereof.

This makes it possible to further improve adhesion of the intermediate layer against the organic semiconductor layer.

In a third aspect of the present invention, there is provided a substrate for an electronic device. The substrate for an electronic device is manufactured by the method described above.

This makes it possible to transfer carriers from the inorganic layer to the organic semiconductor layer through the intermediate layer smoothly and therefore it is possible to obtain a substrate for an electronic device having high carrier transport ability.

In a fourth aspect of the present invention, there is provided an electronic device. The electronic device is provided with the substrate described above.

This makes it possible to obtain an electronic device having improved properties.

In the electronic device according to the present invention, it is preferred that the electronic device is an organic electroluminescence device.

This makes it possible to obtain an organic EL device having improved properties such as high luminous efficiency and the like.

In a fifth aspect of the present invention, there is provided electronic equipment. The electronic equipment is provided with the electronic device described above.

This makes it possible to obtain electronic equipment having high reliability.

DESCRIPTION OF EXEMPLARY EMBODIMENTS

Hereinbelow, a substrate for an electronic device, a method for manufacturing the substrate for an electronic device, an electronic device provided with the substrate for an electronic device, and electronic equipment provided with the electronic device according to the present invention will be described in detail based on preferred embodiments shown in the accompanying drawings.

In this regard, it is to be noted that the following description will be made based on one example of an organic electroluminescence device (hereinafter, simply referred to as an "organic EL device") to which the substrate for an electronic device according to the present invention is applied.

Organic EL Device

Figure 1:
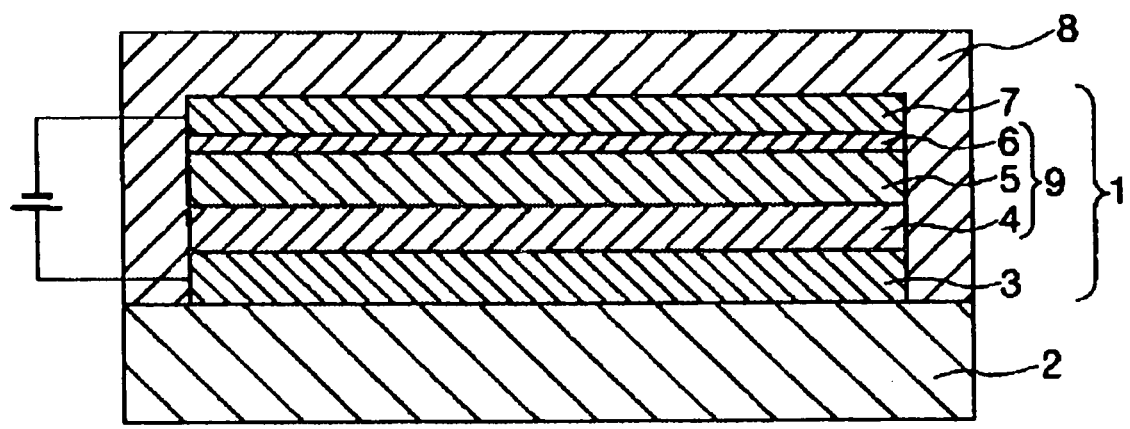
FIG. 1 is a vertical sectional view which shows one example of an organic EL device in accordance with the present invention.
Figure 2:
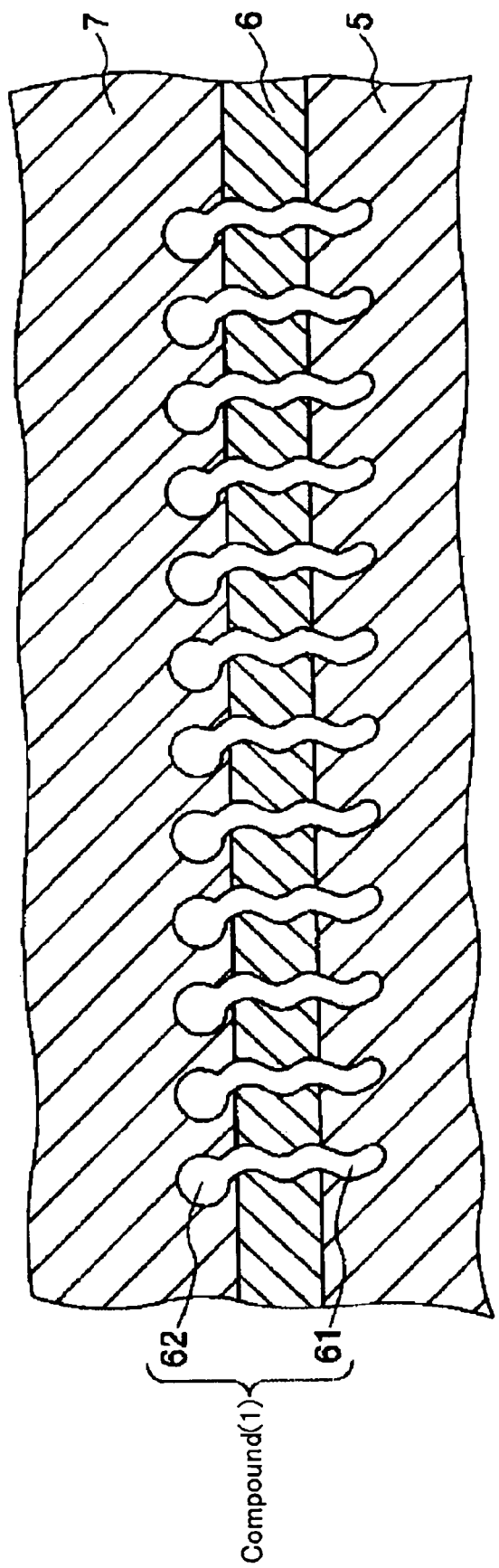
FIG. 2 is an enlarged vertical sectional view of the organic EL device shown in FIG. 1, in which the vicinity of boundaries between an intermediate layer and two layers adjacent to the intermediate layer are schematically shown.

FIG. 1 is a vertical sectional view which shows one example of an organic EL device in accordance with the present invention. FIG. 2 is an enlarged vertical sectional view of the organic EL device shown in FIG. 1, in which the vicinity of boundaries between an intermediate layer and two layers adjacent to the intermediate layer are schematically shown.

In the following description, the upper side in FIGS. 1 and 2 will be referred to as "upper" and the lower side thereof will be referred to as "lower" for convenience of explanation.

The organic EL device 1 shown in FIG. 1 is provided with an anode 3, an cathode 7, and laminate layers 9 provided between the anode 3 and the cathode 7. The laminate layers 9 include a hole transport layer 4, a light emitting layer 5, and an intermediate layer 6, in which these layers 4, 5, 6 are laminated in this order from the side of the anode 3. The whole of the organic EL device 1 is provided on a substrate 2 and is sealed by a sealing member 8.

In this regard, it is to be noted that in the case of the organic EL device 1 of this embodiment, the substrate for an electronic device of the present invention consists of the light emitting layer (organic semiconductor layer) 5, the intermediate layer 6 and the cathode (inorganic layer) 7.

The substrate 2 serves as a support for the organic EL device 1. It is to be noted that in the case where the organic EL device 1 has a structure in which light is emitted from the opposite side of the substrate 2 (that is, a top emission type), the substrate 2 and the anode 3 are not required to have transparency.

On the other hand, in the case where the organic EL device 1 has a structure in which light is emitted from the side of the substrate 2 (that is, a bottom emission type), both the substrate 2 and the anode 3 are respectively required to be formed of materials having substantially transparency (that is, transparent and colorless, colored and transparent, or translucent).

Examples of such a substrate 2 include: a transparent substrate formed of resin materials such as polyethylene terephthalate, polyethylene naphthalate, polypropylene, cycloolefin polymer, polyamide, polyethersulfone, polymethylmethacrylate, polycarbonate, and polyarylate, and glass materials such as quartz glass, and soda glass, and the like; a substrate formed of ceramic materials such as alumina; a substrate formed from a metal substrate such as stainless steel having a surface on which an oxide film (insulation film) is provided; and an opaque substrate such as a substrate formed of opaque resin materials.

An average thickness of such a substrate 2 is not particularly limited, but is preferably in the range of about 0.1 to 10 mm, and more preferably in the range of about 0.1 to 5 mm.

The anode 3 is an electrode which injects holes into the hole transport layer 4 described later.

Namely, as a constituent material of the anode 3 (hereinafter, referred to as "anode material"), materials having a high work function and excellent conductivity are preferably used from the viewpoint of its function that injects holes into the hole transport layer 4.

Examples of such an anode material include: oxides such as ITO (Indium Tin Oxide), IZO (Indium Zinc Oxide), $In_2O_3$, $SnO_2$, $SnO_2$ containing Sb, and ZnO containing Al; metals such as Au, Pt, Ag, Cu, Al, and alloys containing two or more of them; and the like. At least one kind of the above materials may be used as the anode material.

An average thickness of the anode 3 is not limited to any specific value, but is preferably in the range of about 10 to 200 nm, and more preferably in the range of about 50 to 150 nm. If the thickness of the anode 3 is too thin, there is a fear that a function of the anode 3 will not be sufficiently exhibited. On the other hand, if the anode 3 is too thick, there is a fear that the luminous efficiency of the organic EL device 1 will be significantly lowered.

Further, it is preferred that a surface resistance of the anode 3 is as low as possible. Specifically, it is preferably 100Ω/☐ or less, and more preferably 50Ω/☐ or less. A lower limit value of the surface resistance is not particularly limited, but normally it is preferably about 0.1 Ω/☐.

The cathode 7 is an electrode which injects electrons into the intermediate layer 6 described later. Materials having a low work function are preferably used as a constituent material of the cathode 7.

Examples of such a constituent material of the cathode 7 (hereinafter, referred to as "cathode material") include thermal decomposition products of cesium oxide or cesium carbonate, Li, Na, K, Rb, Cs, Be, Mg, Ca, Sr, Ba, Sc, Y, La, Ce, Eu, Er, Yb, Ag, Zn, Cu, Al, alloys containing two or more of them, and the like. Two or more of these materials may be used in combination.

Especially, in the case where an alloy is used as the cathode material, alloys containing stable metal elements such as Ag, Al and Cu (specifically, alloys such as MgAg, AlLi and CuLi) are preferably used. By using such an alloy as the cathode material, it is possible to improve injection efficiency of electrons of the cathode 7 and stability of the cathode 7.

In this regard, it is to be noted that the cathode 7 may be formed from a laminated body having a plurality of layers. In this case, it is preferred that a layer to be provided near the intermediate layer 6 is formed of a cathode material having a lower work function.

In the case where the cathode 7 is formed from a laminated body having two layers, it is preferred that a layer provided far from the intermediate layer 6 is formed of a material containing Ca as a main component thereof, and a layer provided near the intermediate layer 6 is formed of a material containing Al, Ag or alloys as a main component thereof.

An average thickness of such a cathode 7 is not particularly limited, but is preferably in the range of about 1 to 1000 nm, and more preferably in the range of about 100 to 400 nm. If the thickness of the cathode 7 is too thin, a voltage drop is likely to occur due to increase of resistivity or decrease of electrical conductivity. This tendency becomes remarkable due to oxidation reaction of the cathode material. As a result, there is a fear that a function of the cathode 7 will not be sufficiently exhibited.

On the other hand, if the cathode 7 is too thick, in the case where the cathode 7 is formed using a vacuum deposition method or a sputtering method, a temperature inside the formed layer remarkably increases during formation of the cathode 7 or residual stress is increased within the formed cathode 7.

As a result, there is a fear that breaking of the intermediate layer 6 which is to be provided as an under layer (which will be described later) occurs, or the cathode 7 and the intermediate layer 6 is separated from the light emitting layer 5. If such breaking or separation occurs, the luminous efficiency of the organic EL device 1 will be significantly lowered.

As is the same with the anode 3, it is preferred that a surface resistance of the cathode 7 is as lower as possible. Specifically, it is preferably 50Ω/☐ or less, and more preferably 20Ω/☐ or less. A lower limit value of the surface resistance is not particularly limited, but normally it is preferably at about 0.1Ω/☐.

As described above, the laminated layers 9 are provided between the anode 3 and the cathode 7 in contact with them, respectively. The laminated layers 9 include the hole transport layer 4, the light emitting layer (organic semiconductor layer) 5 and the intermediate layer 6, in which these layers 4, 5, 6 are laminated in this order from the side of the anode 3.

The hole transport layer 4 has a function of transporting holes, which are injected from the anode 3, to the light emitting layer 5.

Although various materials can be used as a constituent material of the hole transport layer 4, conjugated compounds having basic structures comprised of various low molecular hole transport materials or various high molecular hole transport materials mentioned below are preferably used.

Such conjugated compounds can transport holes especially smoothly due to a characteristic derived from its unique spread of the electron cloud, and therefore such compounds can have especially excellent hole transport ability.

In this regard, it is to be noted that in the case where low molecular hole transport materials are used as the constituent material of the hole transport layer 4, a dense hole transport layer 4 can be obtained, so that hole transport efficiency of the hole transport layer 4 can be improved.

On the other hand, in the case where high molecular hole transport materials are used for the constituent material of the hole transport layer 4, the hole transport layer 4 can be formed using various application methods such as an ink-jet printing method, a spin coating method, and the like, since such high molecular hole transport materials are dissolved in a solvent relatively easily.

Further, in the case where the low molecular hole transport materials are used in combination with the high molecular hole transport materials, it is possible to obtain a synergistic effect that a dense hole transport layer 4 having the excellent hole transport efficiency can be formed relatively easily using various application methods such as an ink-jet printing method, and the like.

Examples of such low molecular hole transport materials include arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine(TPD2), N,N,N',N'-tetrakis(4-methoxyphenyl)-1,1'-biphenyl-4,4'-diamine(TPD3), N,N'-di(1-naphthyl)-N,N'-diphenyl-1,1'-biphenyl-4,4'-diamine(α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine(PDA); carbazole-based compounds such as carbazole, N-isopropylcarbazole, and N-phenylcarbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly(thiophenevinylene); pyrrole-based compounds such as poly(2,2'-thienylpyrrole), and 1,4-dithioketo- 3,6-diphenyl-pyrrolo-(3,4-c)pyrrolopyrrole; florene-based compounds such as florene; porphyrin-based compounds such as porphyrin, and metal tetraphenylporphyrin; quinacridon-based compounds such as quinacridon; metallic or nonmetallic phthalocyanine-based compounds such as phthalocyanine, copper phthalocyanine, tetra(t-butyl)copper phthalocyanine, and iron phthalocyanine; metallic or nonmetallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. These materials may be employed singly or in combination of two or more of them. All of these materials have the high hole transport ability.

Examples of the high molecular hole transport materials include (1) a polymer or a prepolymer which can be obtained by polymerizing a monomer having any one of the low molecular hole transport materials mentioned above in a main chain or a side chain thereof, and (2) a polymer or a prepolymer which can be obtained by polymerizing an oligomer having any one of the low molecular hole transport materials in a main chain or a side chain thereof, and the like.

Furthermore, as other high molecular hole transport materials, it is possible to use a poly(thiopene/styrenesulfonic acid)-based compounds such as poly(3,4-ethylenedioxythiophene/styrenesulfonic acid) (PEDOT/PSS) and the like. These compounds also have higher hole transport ability.

An average thickness of the hole transport layer 4 is not limited to any specific value, but it is preferably in the range of about 10 to 150 nm, and more preferably in the range of about 50 to 100 nm. If the thickness of the hole transport layer 4 is too thin, there is a fear that pin holes are to be formed. On the other hand, if the thickness of the hole transport layer 4 is too thick, it may result in a reduced transmittance of the hole transport layer 4, thus leading to the case where chromaticity (hue) of emitted light is adversely changed.

The intermediate layer 6 has a function of transporting electrons, which are injected from the cathode 7, to the light emitting layer 5.

Here, the cathode 7 is constituted of the above metallic material as a main component thereof, whereas the light emitting layer 5 is constituted of an organic light emitting material described below as a main component thereof. Therefore, if the cathode 7 and the light emitting layer 5 are formed so as to make contact with each other without providing the intermediate layer 6, since in general interaction between similar materials is larger than interaction between different materials, repulsive force (interfacial tension) between the metallic material and the organic light emitting material (organic material) occurs at an interface between the cathode 7 and the light emitting layer 5.

As a result, a distance between molecules constituting the metallic material and molecules constituting the light emitting material becomes large. This prevents sufficient adhesion from being made between the cathode 7 and the light emitting layer 5. This causes a problem in that electrons are not transferred between the cathode 7 and the light emitting layer 5 smoothly due to increase of resistance therebetween.

On the other hand, in the organic EL device 1 (that is, an electronic device provided with the substrate for an electronic devices of the present invention), the intermediate layer 6 having a specific structural characteristic is provided between the cathode 7 and the light emitting layer 5 so as to make contact with both of the cathode 7 and the light emitting layer 5.

Namely, in the organic EL device 1, the intermediate layer 6 constituted of a compound represented by a general formula R—X—O-M (hereinafter, the compound will be referred to as "compound (1)") as a main component thereof is provided between the cathode 7 and the light emitting layer 5. In this compound (1), the R is a hydrocarbon group, the X is any one of binding groups comprising a single bond, a carbonyl group and a sulfonyl group, and the M is any one of a hydrogen atom and a metal atom.

Such a compound (1) has a nonpolar portion 61 constituted of the hydrocarbon group R and a polar portion 62 constituted of a part including the atom M.

And as shown in FIG. 2, molecules of the compound (1) are oriented (that is, the compound (1) is oriented) along a thickness direction of the intermediate layer 6 in a state that each nonpolar portion 61 is positioned on the side of the light emitting layer (organic semiconductor layer) 5 and each polar portion 62 is positioned on the side of the cathode (inorganic layer) 7.

As described above, since the polar portion 62 positioned on the side of the cathode 7 has a structure of X—O-M (that is, a part of the compound (1) other than the hydrocarbon group R), and the structure of X—O-M has large bias of electron distribution in an electron cloud thereof as compared with the hydrocarbon group R, the polar portion 62 exhibits excellent affinity for a metallic material which is a main component of the cathode 7.

As a result, a distance between atoms of the metallic material (cathode material) and molecules of the compound (1) can be decreased. This makes it possible to obtain sufficient adhesion between the cathode 7 and the intermediate layer 6. For this reason, electrons can be transferred from the cathode 7 to the intermediate layer 6 smoothly.

Further, since the light emitting layer 5 is constituted of an organic material (light emitting material) and the light emitting material, in general, includes hydrocarbon groups (for example, alkyl groups), the nonpolar portion 61 positioned on the side of the light emitting layer 5 (that is, the hydrocarbon group R) exhibits affinity for the light emitting material.

As a result, a distance between molecules of the light emitting material and molecules of the compound (1) can be decreased. This makes it possible to obtain sufficient adhesion between the light emitting layer 5 and the intermediate layer 6. For this reason, electrons can be transferred from the intermediate layer 6 to the light emitting layer 5 smoothly.

For these reasons, by providing the intermediate layer 6 having such a structure between the light emitting layer 5 and the cathode 7, electrons can be transferred from the cathode 7 to the intermediate layer 6, and further from the intermediate layer 6 to the light emitting layer 5 smoothly.

Namely, electrons can be transferred from the cathode 7 to the light emitting layer 5 through the intermediate layer 6 smoothly. As a result, it is possible to obtain a substrate for an electronic device having excellent electron (carrier) transport ability.

In such an intermediate layer 6, the compound (1) may merely make contact with the cathode 7, but it is preferred that a part thereof (a part of the side of the polar portion 62) is penetrated into the cathode 7 as shown in FIG. 2. This makes it possible to further improve adhesion between the intermediate layer 6 and the cathode 7. As a result, electrons can be transferred from the cathode 7 to the intermediate layer 6 more smoothly.

Further, the compound (1) may also merely make contact with the light emitting layer 5, but it is preferred that a part thereof (a part of the side of the nonpolar portion 61) is penetrated into the light emitting layer 5 as shown in FIG. 2.

This makes it possible to further improve adhesion between the intermediate layer 6 and the light emitting layer 5. As a result, electrons can be transferred from the intermediate layer 6 to the light emitting layer 5 more smoothly.

A structure of the compound (1) is configured (determined) so that its molecules can be oriented in a state that the nonpolar portion 61 is positioned on the side of the light emitting layer 5 and the polar portion 62 is positioned on the side of the cathode 7 within the intermediate layer 6.

Hereinafter, each of portions (nonpolar portion 61 and polar portion 62) of the compound (1) will be described in detail.

The nonpolar portion 61 is constituted of the hydrocarbon group R.

The hydrocarbon group R may be any of a saturated hydrocarbon group and an unsaturated hydrocarbon group, but the saturated hydrocarbon group is more preferable. The saturated hydrocarbon group has only small bias of electron distribution in an electron cloud thereof. Therefore, by selecting the saturated hydrocarbon group as the hydrocarbon group R, affinity between the light emitting material and the hydrocarbon group R can be further improved.

A structure of the hydrocarbon group R may include any of a straight chain structure, a branched structure and a cyclic structure. In this regard, by selecting the hydrocarbon group R having the straight chain structure, in a step of forming an intermediate layer <4> described below, a part of the compound (1) (hydrocarbon group R) can be penetrated into the light emitting layer 5 relatively easily.

Further, by selecting the hydrocarbon group R having the branched structure and/or the cyclic structure, when a part of the compound (1) (hydrocarbon group R) is penetrated into the light emitting layer 5, the part of the compound (1) exhibits anchor effect to the light emitting layer 5. As a result, adhesion between the light emitting layer 5 and the intermediate layer 6 can be further improved.

Further, the number of carbon atom(s) contained in the hydrocarbon group R is not particularly limited, but is preferably in the range of 1 to 30, and more preferably in the range of 8 to 22. This makes it possible to improve (increase) affinity (that is, interaction) between the hydrocarbon group R and the light emitting material.

Therefore, the hydrocarbon group R can be positioned on the side of the light emitting layer 5 more reliably. As a result, electrons injected from the cathode 7 can be transferred to the light emitting layer 5 smoothly.

Now, the polar portion 62 is constituted of a binding group X, an oxygen atom and an atom M.

The binding group X may be any one of a single bond (bonding dash), a carbonyl group and a sulfonyl group, but the carbonyl group or the sulfonyl group is more preferable. By selecting the carbonyl group or the sulfonyl group as the binding group X, bias of electron distribution in an electron cloud of the polar portion 62 can be made large.

This makes it possible to improve affinity between the polar portion 62 and a metallic material. Therefore, the polar portion 62 (atom M) can be positioned on the side of the cathode 7 reliably.

The atom M may be any one of a hydrogen atom and a metal atom, but is not limited thereto. In the case of the metal atom, it is preferred that the metal atom and an atom contained in the constituent material of the cathode 7 (metallic material) belong to a congener in a periodic table.

This makes it possible to improve affinity between the atom M (that is, the polar portion 62) and the metallic material. Therefore, adhesion between the intermediate layer 6 and the cathode 7 becomes more excellent.

This atom M (metal atom) is not particularly limited insofar as it can be bonded to an oxygen atom, but an atom having a low work function is preferred. Examples of such an atom include Be, Mg and Zn as well as alkali metals and alkali earth metals.

By forming the intermediate layer 6 using the compound (1) having the above atom as the atom M so that a part of the compound (1) is penetrated into the cathode 7, the cathode 7 can have a lower work function. As a result, it is possible to improve the properties of the cathode 7.

Especially, it is preferred that such an atom M is any one of Li, Na, K, Be, Mg, Cs, Zn and Ca. Since each of these atoms has especially a small work function and is preferably used as the constituent material of the cathode 7, the above effect is exhibited more conspicuously.

Specifically, examples of the above compound (1) include: higher fatty acid metallic salts (metallic soaps) such as lithium stearate, magnesium stearate, calcium stearate and sodium laurate, higher fatty acids such as lauric acid, palmitic acid, myristic acid, oleic acid and behenic acid; higher alcohols such as lauryl alcohol, myristyl alcohol, palmityl alcohol, stearyl alcohol and behenyl alcohol; higher alkyl benzene sulfonic acid metallic salts such as sodium lauryl benzene sulfonate and lithium stearyl benzene sulfonate; higher alkyl benzene sulfonic acids such as lauryl benzene sulfonic acid and stearyl benzene sulfonic acid; and alcohol derivatives of fluorene such as 9-fluorenol and oxyfluorene.

In this regard, it is to be noted that the intermediate layer 6 may be constituted of any one of the above compounds (1) or may be constituted of in combination of two or more of the above compounds (1).

An average thickness of the intermediate layer 6 may slightly varies depending on the structure of the compound (1), but is preferably 10 nm or less, and more preferably in the range of about 1 to 5 nm.

By setting the average thickness of the intermediate layer 6 to a value within the above range, the intermediate layer 6 can be formed relatively easily as a monomolecular film in which the molecules of the compound (1) are oriented (that is, the compounds (1) are oriented) in a state that each polar portion 62 is positioned on the side of the cathode 7 and each nonpolar portion 61 is positioned on the side of the light emitting layer 5, respectively.

As a result, since transfer of electrons is carried out in one molecule of the compound (1) in a thickness direction of the intermediate layer 6, the electrons can be transferred from the cathode 7 to the light emitting layer 5 through the intermediate layer 6 more smoothly.

When current flows between the anode 3 and the cathode 7 (that is, voltage is applied between the anode 3 and the cathode 7), holes move in the hole transport layer 4 and electrons move in the light emitting layer 5 through the intermediate layer 6 and therefore excitons (exciters) are produced mainly at the vicinity of the boundary between the light emitting layer 5 and the hole transport layer 4 through the combining process of the holes and the electrons.

The excitons are recombined in a certain period of time. At that time, excitation energy accumulated in the process of the production of the excitons is released as light such as fluorescence, phosphorescence, or the like. This is electroluminescence emission.

As a constituent material (hereinafter, refer to as "light emitting material") of the light emitting layer 5, various materials can be used if, by using such materials, holes are injected into the light emitting layer 5 from the side of the anode 3 and electrons are injected into the light emitting layer 5 from the side of the cathode 7 when a voltage is applied between the anode 3 and the cathode 7 to thereby provide a field in which the holes and the electrons can be recombined.

As such light emitting materials, there are various low molecular type light emitting materials and various high molecular type light emitting materials as mentioned hereinbelow, and at least one of these materials can be used.

In this regard, it is to be noted that when the low molecular type light emitting materials are used, a dense light emitting layer 5 can be obtained, thereby enabling the luminous efficiency of the light emitting layer 5 to be increased.

On the other hand, when the high molecular type light emitting materials are used, it is possible to form a light emitting layer 5 easily using any one of various application methods such as an ink-jet printing method and the like since such materials are dissolved into a solvent relatively easily.

Further, when the low molecular type light emitting materials are used in combination with the high molecular type light emitting material, it is possible to obtain a synergistic effect of both the low molecular type light emitting materials and the high molecular type light emitting materials.

That is to say, it is possible to obtain a synergistic effect that a dense light emitting layer 5 having the high luminous efficiency can be easily formed by using various application methods such as an ink-jet printing method and the like.

Examples of such low molecular type light emitting materials include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-dicarboxylmide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium(III) ($Eu(TTA)_3$ (phen)), fac-tris(2-phenylpyridine) iridium ($Ir(ppy)_3$), and (2,3,7,8,12,13,17,18-octaethyl-21H, 23H-porphin) platinum (II), and the like.

Examples of such high molecular type light emitting materials include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly (3-alkylthiophene) (PAT), and poly(oxypropylene)triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6am4), poly(9,9-dioctyl-2,7-divinylenefluorenyl)-ortho-co(anthracene-9,10-diyl); polyparaphenylene-based compounds such as poly(para-phenylene) (PPP), and poly(1, 5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

An average thickness of the light emitting layer 5 is not limited to any specific value, but is preferably in the range of about 10 to 150 nm, and more preferably in the range of about 50 to 100 nm. By setting the thickness of the light emitting layer 5 to a value within the above range, the recombination of the holes and the electrons efficiently occurs, thereby enabling the luminous efficiency of the light emitting layer 5 to be further improved.

In this regard, it is to be noted that the light emitting layer 5 is not limited to a single layer. For example, the light emitting layer 5 may be formed into a multilayer structure in which an electron transport layer having excellent electron transport ability is provided in the light emitting layer 5 in contact with the intermediate layer 6.

The light emitting layer 5 having such a structure makes it possible to further improve the electron transport ability of the light emitting layer.

Examples of materials (electron transport materials) that can be used for the electron transport layer 6 are not particularly limited, but include: benzene-based compounds (starburst-based compounds) such as 1,3,5-tris[(3-phenyl-6-trifluoromethyl)quinoxaline-2-yl] benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4, 5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used at least one of them.

The sealing member 8 is provided so as to cover the anode 3, the hole transport layer 4, the light emitting layer 5, the intermediate layer 6, and the cathode 7. In this way, the sealing member 8 has a function of hermetically sealing these layers and shutting off the oxygen and the moisture.

By providing such a sealing member 8, it is possible to suppress or prevent the oxidation of the cathode 7, so that it is possible to obtain the effects that improve the reliability of the organic EL device 1 or prevent the organic EL device 1 from deteriorating or making alteration (that is, the organic EL device 1 can have improved durability).

Examples of a constituent material of the sealing member 8 include Al, Au, Cr, Nb, Ta and Ti, alloys containing them, silicon oxide, various resin materials, and the like.

Further, the sealing member may be formed into a flat plate shape, and provided on the cathode 7 so as to face the substrate 2 so that a space is created between the sealing member and around the layers, and then the space is filled with a seal material such as thermosetting resin or the like to thereby seal the organic EL device 1.

In this organic EL device 1, when a voltage of 0.5 V is applied between the anode 3 and the cathode 7 so that the cathode 7 is negative and the anode 3 is positive, it is preferred that the organic EL device 1 has a characteristic that a resistance value is preferably 100 $\Omega/cm^2$ or more, and more preferably 1 $k\Omega/cm^2$ or more.

The characteristic of the organic EL device 1 described above means that occurrence of short circuit (leakage of current) between the cathode 7 and the anode 3 is appropriately prevented or suppressed. Therefore, an organic EL device having such a characteristic can have especially high luminous efficiency.

Such an organic EL device 1 can be manufactured as follows.

In this method for manufacturing the organic EL device 1, the method for manufacturing a substrate for an electronic device according to the present invention is applied to a step of providing the intermediate layer 6 (step of forming an intermediate layer) and a step of providing the cathode (inorganic layer) 7 (step of forming a cathode).

<1> Step of Forming an Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

<2> Step of Forming a Hole Transport Layer

Next, a hole transport layer 4 is formed on the anode 3.

The hole transport layer 4 can be formed, for example, by supplying a hole transport layer material which is prepared by dissolving any one of the hole transport layer materials as described above in a solvent or dispersing any one of the hole transport layer materials as described above in a dispersion medium onto the anode 3, and then removing the solvent or the dispersion medium contained in the hole transport layer material.

In this regard, it is to be noted that the hole transport layer 4 also can be obtained by using the dry plating as described in the above step <1>.

Various methods can be used for supplying the hole transport layer material onto the anode 3. Examples of such methods include application methods such as an ink-jet method, a spin coating method, a liquid source misted chemical deposition method (LSMCD method), a casting method, a micro gravure coating method, a gravure coating method, a bar coating method, a roll coating method, a wire-bar coating method, a dip coating method, a spray coating method, a screen printing method, a flexographic printing method, an offset printing method, and a micro contact printing method, and the like, and these methods can be employed singly or in combination of two ore more of them.

Examples of the solvent or dispersion medium that can be used for preparing the hole transport layer material include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, benzene, trimethylbenzene, and tetramethylbenzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

<3> Step of Forming a Light Emitting Layer

Next, a light emitting layer 5 is formed on the hole transport layer 4.

The light emitting layer 5 can be formed using the same method described above with reference to the hole transport layer 4. In other words, the light emitting layer 5 can be formed by using the method as described above with reference to the step of forming the hole transport layer <2> using any one or more of the light emitting materials described above.

<4> Step of Forming an Intermediate Layer (First Step)

Next, an intermediate layer 6 is formed on the light emitting layer 5.

As a method for forming the intermediate layer 6, various methods can be used. Examples of such methods include: <I> a method in which a liquid material containing the compound (1) is applied onto the light emitting layer 5 using an application method; <II> a method in which the compound (1) is applied onto the light emitting layer 5 using a vapor phase film formation method such as a vacuum deposition method, a sputtering method or a cluster ion beam method; <III> a method in which a thin molecular film composed of oriented molecules of the compound (1) is formed on the surface of a liquid, a substrate on which the light emitting layer 5 has been formed is softly immersed into the liquid, and then the substrate is pulled out from the liquid so that the thin molecular film is provided on the surface of the substrate (light emitting layer 5); and <IV> a method in which a thin molecular film composed of oriented molecules of the compound (1) is formed on the surface of a liquid, and then a substrate on which the light emitting layer 5 has been formed is softly brought into contact with the thin molecular film so that the thin molecular film is transferred on the surface of the substrate (light emitting layer 5). Two or more of these methods may be used in combination.

Among these methods, the method <1> is preferably used as the method for forming the intermediate layer 6. According to such a method, the intermediate layer 6 can be formed relatively easily without using a large scale manufacturing apparatus.

Hereinbelow, the case where the intermediate layer 6 is formed by using the method <1> will be described.

<4-1> First, a liquid material containing the compound (1) is prepared.

In this regard, it is to be noted that the liquid material may be any one of a liquid solution in which the compound (1) is dissolved into a solvent and a dispersion liquid in which the compound (1) is dispersed into a dispersion medium, but the liquid solution is more preferable. By selecting the liquid solution as the liquid material, the compound (1) can be oriented reliably in the next step <4-2>.

The solvent or dispersion medium to be used for preparing the liquid material may be selected from the solvents or dispersion mediums mentioned above with reference to the step <2>.

A concentration of the compound (1) in the liquid material varies slightly depending on the kinds of the compounds (1) to be used, but is preferably in the range of about 0.01 to 0.5 mol/L, and more preferably in the range of about 0.1 to 0.3 mol/L. By setting the concentration of the compound (1) in the liquid material to a value within the above range, when the liquid material is dried in a subsequent step <4-3>, the intermediate layer 6 can be obtained as a monomolecular film constituted of the compound (1).

<4-2> Next, the liquid material is applied onto the light emitting layer 5.

As a result, the molecules of the compound (1) are oriented along a thickness direction of the light emitting layer 5 in a state that each hydrocarbon group R is positioned on the side of the intermediate layer 6 adjacent to the light emitting layer 5 and each polar portion 62 (metal atom M) is positioned on the opposite side of the intermediate layer 6 due to affinity between the nonpolar portion 61 (that is, the hydrocarbon group R) and the light emitting material.

As a method for applying the liquid material onto the light emitting layer 5, the same methods for applying the hole transport layer formation material onto the light emitting layer 5 as described in the above step <2> can be used.

In the case where in the above step <4-1>, a solvent or dispersion medium of the type that can dissolve or swell the light emitting layer 5 (that is, light emitting material) is selected as the solvent or the dispersion medium to be used for preparing the liquid material, the vicinity of the upper surface of the light emitting layer 5 can be dissolved or swelled.

This makes it possible to provide the compound (1) in a state that a part thereof (nonpolar portion 61) is penetrated into the light emitting layer 5. Therefore, adhesion between the light emitting layer 5 and the intermediate layer 6 to be formed in the next step <4-3> can be further improved.

<4-3> Next, the liquid material applied on the light emitting layer 5 is dried.

In this way, it is possible to obtain an intermediate layer 6 in which the molecules of the compound (1) are oriented in a state that each hydrocarbon group R is positioned on the side of the light emitting layer 5 and each atom M is positioned on the opposite side of the light emitting layer 5.

A method for drying the liquid material is not particularly limited, but artificial drying methods such as a drying method by heating and a suction drying method, as well as a natural drying method may be used.

In the case of using the artificial drying methods, a temperature of the ambience during drying processing is preferably in the range of about 20 to 90° C., and more preferably in the range of about 50 to 80° C.

A pressure of the ambience during drying processing is preferably in the range of about 0.1 to 10 Pa, and more preferably in the range of about 1 to 5 Pa.

The processing time varies depending on a material for forming the intermediate layer 6, but is preferably in the range of about 1 to 90 minutes, and more preferably in the range of about 5 to 30 minutes.

By setting the temperature and the pressure of the ambience and the processing time to values within the above ranges, the liquid material can be dried appropriately so that the intermediate layer 6 is formed reliably.

In this regard, it is to be noted that the dried intermediate layer 6 may be subjected to post-treatments such as a heat treatment and a mechanical oriented treatment. Such a mechanical oriented treatment is carried out by physically rubbing the upper surface of the intermediate layer 6 with a cloth made of soft fibers in one direction thereof softly and repeatedly.

This makes it possible to stabilize a state that the molecules of the compound (1) are oriented within the intermediate layer 6. Namely, the molecules of the compound (1) can be more reliably oriented in a state that each hydrocarbon group R is positioned on the side of the intermediate layer 6 adjacent to the light emitting layer 5 and each atom M is positioned on the opposite side of the intermediate layer 6.

<5> Step of Forming a Cathode (Second Step)

Next, a cathode 7 is formed on the thus formed intermediate layer 6. Namely, the intermediate layer 6 has one surface and the other surface which is opposite to the one surface and makes contact with the light emitting layer 5, and the cathode 7 is formed on the one surface of the intermediate layer 6.

The cathode 7 can be formed by using a vacuum deposition method, a sputtering method, a cluster ion beam method or the like. By using such a method, a constituent material of the cathode 7 can be applied onto the intermediate layer 6 so as to surround each atom M which is positioned at the opposite side of the light emitting layer 5 within the intermediate layer 6.

As a result, a part (polar portion 62) of the compound (1) is penetrated into the vicinity of a surface of the cathode 7 which makes contact with the intermediate layer 6. This makes it possible to further improve adhesion between the cathode 7 and the intermediate layer 6.

<6> Step of Forming a Sealing Member

Next, a sealing member 8 is formed so as to cover the anode 3, the hole transport layer 4, the light emitting layer 5, the intermediate layer 6, and the cathode 7.

The sealing member 8 may be formed (or provided) by bonding a box-shaped protective cover constituted of any one of the materials mentioned above onto the laminated body including these layers 3, 4, 5, 6 and 7 with a curable resin (adhesive).

As for such a curable resin, any of thermosetting resins, photocurable resins, reactive curable resins, or anaerobic curable resins may be used.

the organic EL device 1 is manufactured through the above steps.

In the present embodiment described above, an explanation was made with regard to the case where the organic EL device 1 has the intermediate layer 6 provided between the cathode 7 and the light emitting layer 5 so as to make contact with both of the cathode 7 and the light emitting layer 5.

However, the present invention is not limited to such a case. In the present invention, for example, the intermediate layer 6 may be provided between the anode 3 and the hole transport layer 4 so as to make contact with both of the anode 3 and the hole transport layer 4.

Further, in the case where the intermediate layer 6 is provided between the anode 3 and the hole transport layer 4, the intermediate layer 6 to be provided between the cathode 7 and the light emitting layer 5 may be omitted.

The organic EL device 1 as described above can be used as a light source and the like as well as a display apparatus and the like. Further, the organic EL device 1 can be used for various kinds of optical applications.

Furthermore, in the case of applying the organic EL device 1 to the display apparatus, a plurality of the organic EL devices 1 are provided in the display apparatus. One Example of such a display apparatus will be described below with reference to FIG. 3.

Figure 3:
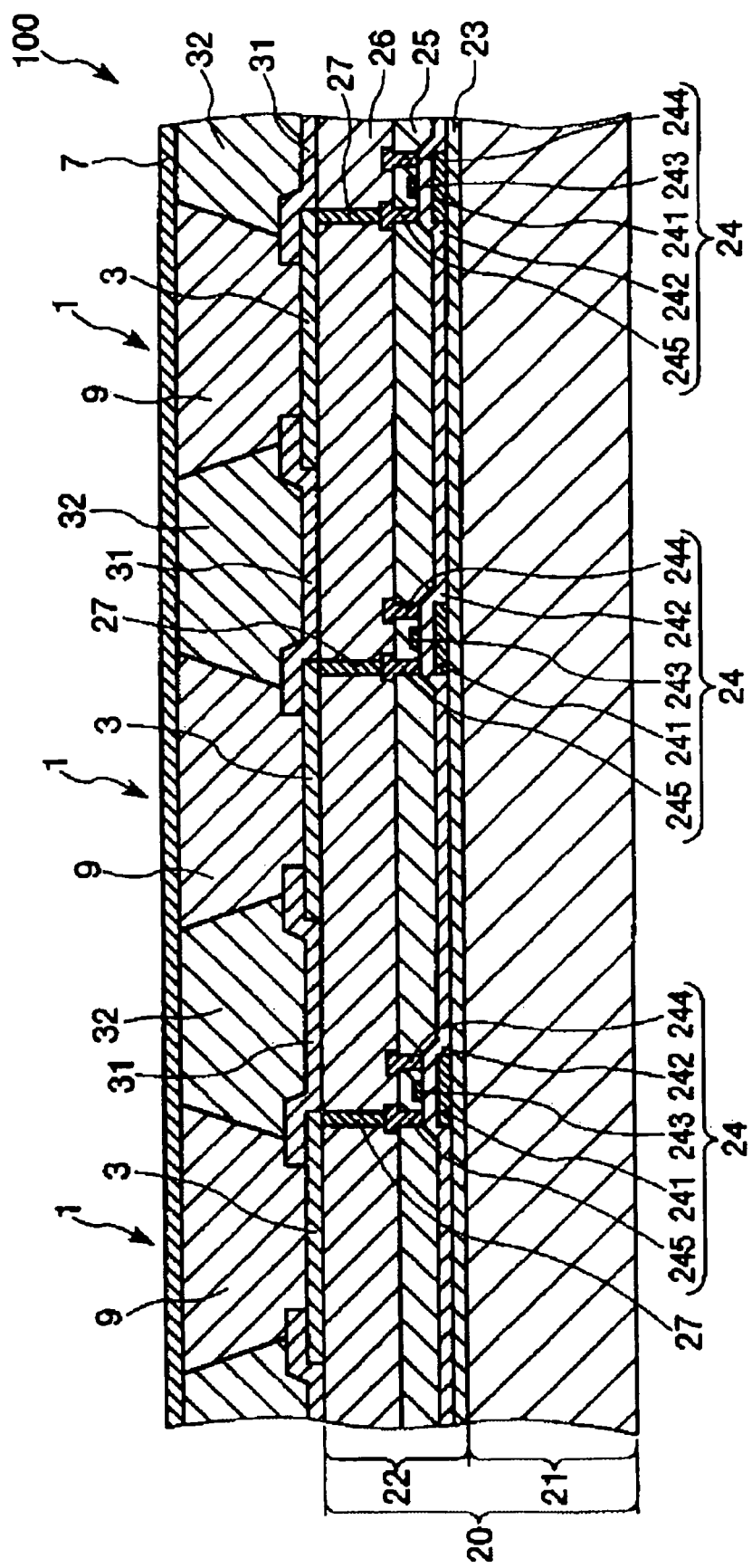
FIG. 3 is a vertical sectional view which shows an embodiment of a display apparatus provided with the organic EL device.

FIG. 3 is a vertical section view which shows a display apparatus provided with a plurality of organic EL devices.

As shown in FIG. 3, a display apparatus 100 includes a base 20 and a plurality of the organic EL devices 1 provided on the base 20.

The base 20 includes a substrate 21 and a circuit section 22 formed on the substrate 21.

The circuit section 22 includes a protective layer 23 provided on the substrate 21 and formed from a titanium oxide layer, driving TFTs (switching element) 24 formed on the protective layer 23, a first insulation layer 25, and a second insulation layer 26.

The driving TFTs 24 include semiconductor layers 241 made of a silicon, gate insulation layers 242 formed on the semiconductor layers 241, gate electrodes 243 formed on the gate insulation layers 242, source electrodes 244, and drain electrodes 245.

The organic EL devices 1 are provided on the circuit section 22 having the above structure so as to be associated with the respective driving TFTs 24. Further, the adjacent organic EL devices 1 are partitioned by the first partitioning wall portions 31 and second partitioning wall portions 32.

In this embodiment, the anode 3 of each of the organic EL devices 1 constitutes a pixel electrode, and it is electrically connected to the drain electrodes 245 of the corresponding driving TFTs 24 through the wirings 27. Further, the cathodes 7 of the organic EL devices 1 are formed from a common electrode.

Furthermore, a sealing member (not shown in the drawing) is joined to the base 20 so as to cover the respective organic EL devices 1 to thereby seal the organic EL devices 1.

The display apparatus 100 may be formed into a single color display type, but the display apparatus 100 can be configured to display a color image by selecting light emitting materials used for the respective organic EL devices 1.

Electronic Equipment

The above display apparatus 100 provided with the organic EL devices 1 (an electronic device of the present invention) can be used for various electronic equipment.

Figure 4:
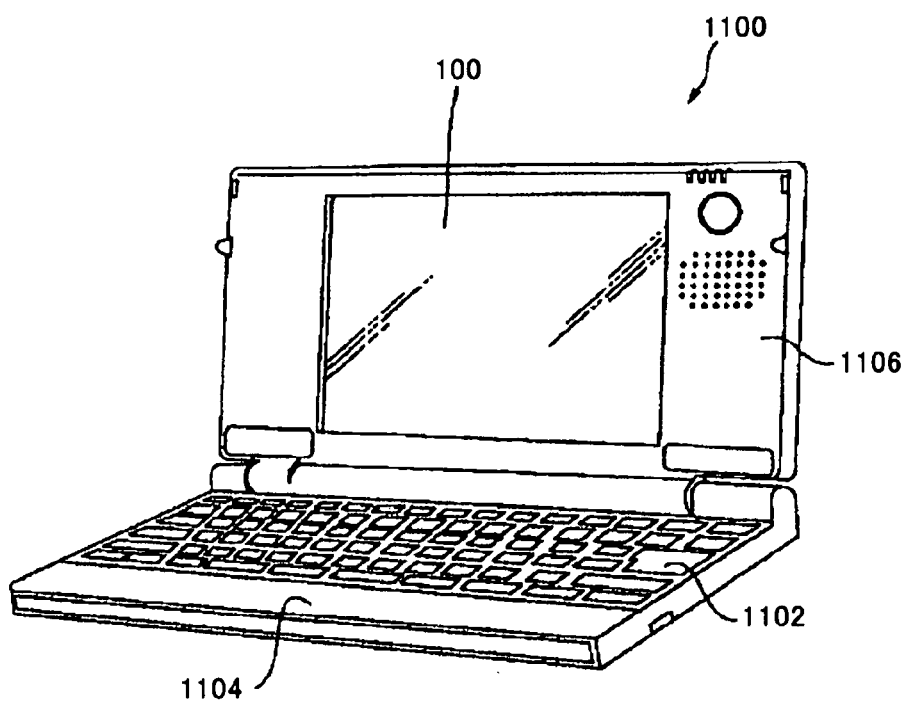
FIG. 4 is a perspective view which shows the structure of a personal mobile computer (or a personal notebook computer) which is one example of the electronic equipment according to the present invention.

FIG. 4 is a perspective view which shows the structure of a personal mobile computer (or a personal notebook computer) which is one example of the electronic equipment according to the present invention.

In FIG. 4, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display apparatus 100 described above.

Figure 5:
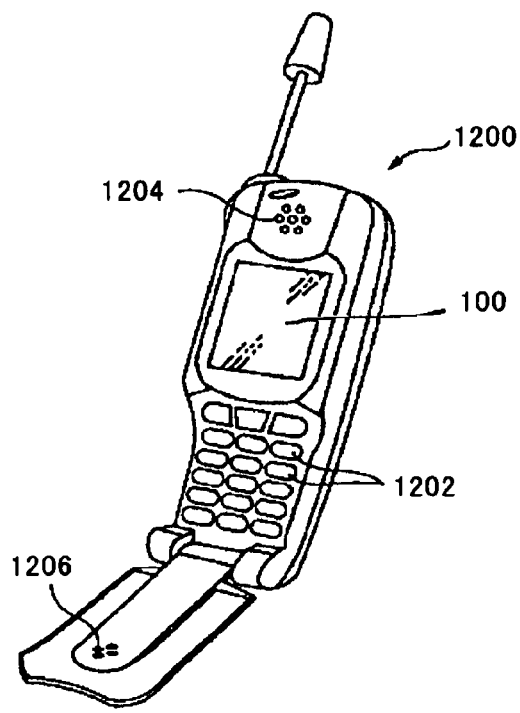
FIG. 5 is a perspective view which shows the structure of a mobile phone (including the personal handyphone system (PHS)) which is the other example of the electronic equipment according to the present invention.

FIG. 5 is a perspective view which shows the structure of a mobile phone (including the personal handyphone system (PHS)) which is the other example of the electronic equipment according to the present invention.

The mobile phone 1200 shown in FIG. 5 includes a plurality of operation buttons 1202, an earpiece 1204, a mouthpiece 1206, and a display.

In this mobile phone 1200, the display is constructed from the display apparatus 100 as described above.

Figure 6:
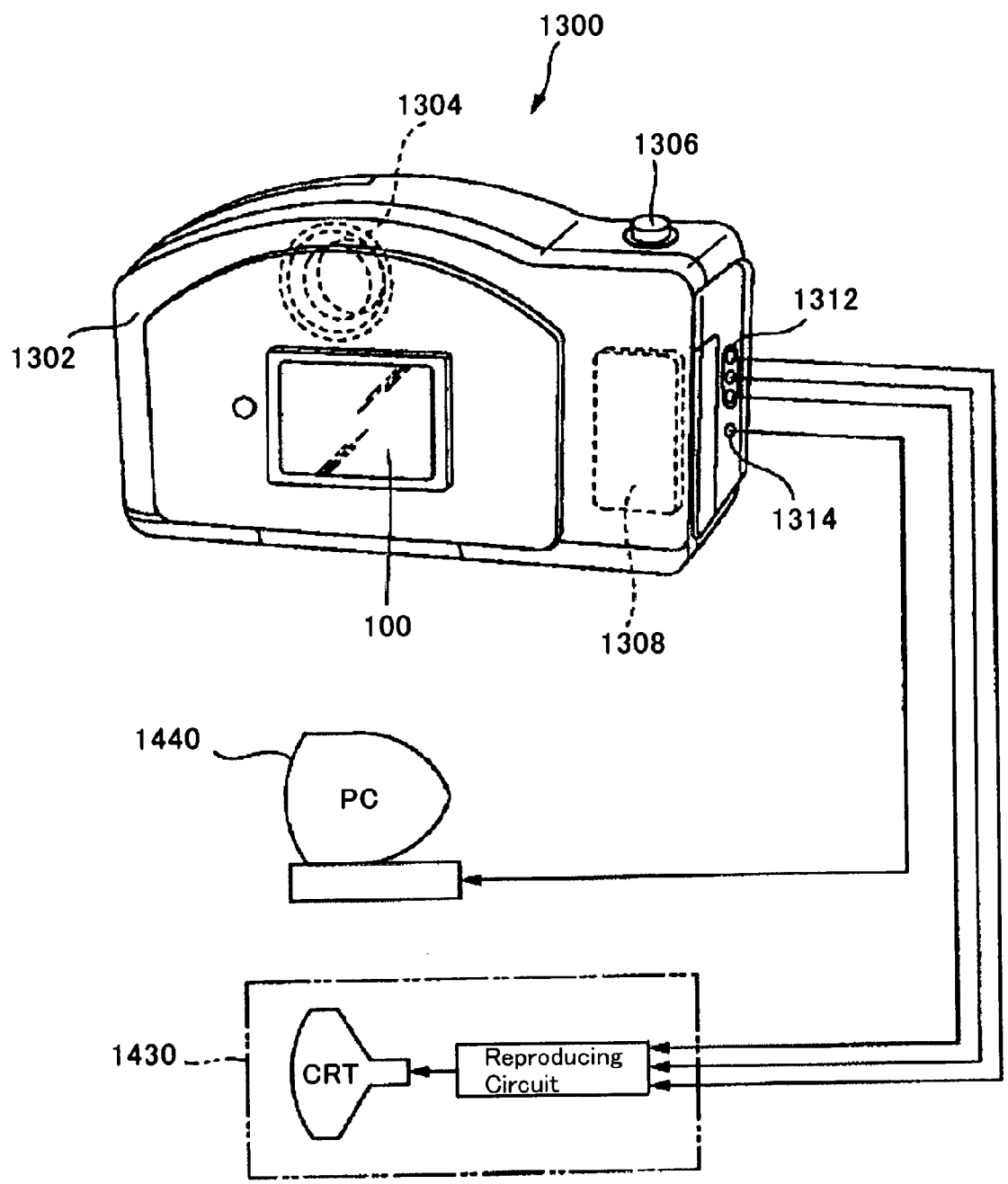
FIG. 6 is a perspective view which shows the structure of a digital still camera which is still other example of the electronic equipment according to the present invention.

FIG. 6 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display apparatus 100 described above.

In the inside of the case, there is provided a circuit board 1308. The circuit board 1308 has a memory capable of storing an image pickup signal.

In the front surface of the case 1302 (in FIG. 6, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 6, when necessary, a television monitor 1430 and a personal computer 1440 are connected to the video signal output terminal 1312 and the input-output terminal for data communication 1314, respectively.

In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 4, the mobile phone shown in FIG. 5, and the digital still camera shown in FIG. 6 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The substrate for an electronic device, the method for manufacturing the substrate for an electronic device, the electronic device, and the electronic equipment according to the present invention have been described based on the embodiments shown in the drawings, but the present invention is not limited thereto.

For example, the electronic device of the present invention provided with the substrate for an electronic device of the present invention can be applied to a photoelectric conversion element, a thin transistor and the like in addition to the organic EL device described above.

EXAMPLES

Next, the present invention will be described with based on the actual examples.

1. Manufacture of Organic EL Device

Five organic EL devices were manufactured in each of the following Examples and Comparative Examples. In each of the Examples and Comparative Examples, each organic EL device was manufactured as follows.

Example 1A

<1A> First, an ITO electrode (that is, an anode) was formed on a transparent glass substrate having an average thickness of 0.5 mm by a sputtering method so as to have an average thickness of 150 nm.

<2A> Next, a hole transport layer having an average thickness of 10 nm was formed on the ITO electrode by a vacuum evaporation of copper phthalocyanine.

<3A> Next, a 1.7 wt % xylene solution of poly(9,9-dioctyl-2,7-divinylenefluorenyl-ortho-co(anthracene-9,10-diyl) (weight average molecular weight: 200,000) was applied onto the hole transport layer by a spin coating method, and was then dried under the conditions of 100° C.×10 minutes in a nitrogen atmosphere, and further dried under the conditions of 100° C.×60 minutes under reduced pressure to thereby form a light emitting layer having an average thickness of 50 nm on the hole transport layer.

<4A> Next, a 0.1 wt % hot ethyl alcohol solution of lithium stearate was filtered using a Teflon ("Teflon" is a registered trademark) filter having an opening size of 25 nm (produced by SKC) under high temperature to separate insoluble matters. As a result, an intermediate layer formation material was obtained.

<5A> Next, the intermediate layer formation material prepared in the above step <4A> was applied onto the light emitting layer by a spin coating method, and was then dried under the conditions of 60° C.×30 minutes in a nitrogen atmosphere to thereby form an intermediate layer having an average thickness of 5 nm on the light emitting layer.

<6A> Next, the intermediate layer was heated under the conditions of 50° C.×120 minutes under reduced pressure to stabilize it.

Thereafter, the intermediate layer formed on the light emitting layer was analyzed using a repeated reflection type polarizing infrared absorption spectrum method and a high resolution secondary ion mass spectrometry method (TOFSIMS method). As a result of the analysis, it was confirmed that molecules of the lithium stearate were oriented in a state that each heptadecyl group was positioned on the side of the intermediate layer adjacent to the light emitting layer and each lithium atom was positioned on the opposite side of the intermediate layer.

<7A> Next, an AlLi electrode (that is, a cathode) having an average thickness of 300 nm was formed on the intermediate layer by a vacuum evaporation.

<8A> Next, a protection cover made of polycarbonate was provided so as to cover these layers described above, and was then secured and sealed with an ultraviolet curable resin to obtain an organic EL device.

Example 2A

An organic EL device was obtained in the same manner as in Example 1A, except that the intermediate layer formation material was prepared by changing the lithium stearate to sodium laurate in the above step <4A>.

Example 3A

An organic EL device was obtained in the same manner as in Example 1A, except that the intermediate layer formation material was prepared by changing the lithium stearate to behenic acid in the above step <4A>.

Example 4A

An organic EL device was obtained in the same manner as in Example 1A, except that the intermediate layer formation material was prepared by changing the lithium stearate to palmityl alcohol in the above step <4A>.

Example 5A

An organic EL device was obtained in the same manner as in Example 1A, except that the intermediate layer formation material was prepared by changing the lithium stearate to isoalkyl alcohol represented by a chemical formula $C_8H_{17}$ $(C_3H_7)$CH—OH in the above step <4A>.

Example 6A

An organic EL device was obtained in the same manner as in Example 1A, except that the intermediate layer formation material was prepared by changing the lithium stearate to lithium stearyl benzene sulfonate in the above step <4A>.

Example 7A

An organic EL device was obtained in the same manner as in Example 1A, except that the intermediate layer formation material was prepared by changing the lithium stearate to lauryl benzene sulfonic acid in the above step <4A>.

Example 8A

An organic EL device was obtained in the same manner as in Example 1A, except that a 0.1 wt % diluted acetic acid solution of oxyfluorene was used as the intermediate layer formation material instead of the intermediate layer formation material prepared in the above step <4A>.

Comparative Example 1A

An organic EL device was obtained in the same manner as in Example 1A, except that the above steps <4A> to <6A> (that is, the step of forming the intermediate layer) were omitted.

Example 1B

<1B> First, an ITO electrode (that is, an anode) having an average thickness of 150 nm was formed in the same manner as in the above step <1A>.

<2B> Next, a 0.02 wt % hot ethyl alcohol solution of lithium stearate was filtered using a Teflon ("Teflon" is a registered trademark) filter having an opening size of 25 nm (produced by SKC) under high temperature to separate insoluble matters. As a result, an intermediate layer formation material was obtained.

<3B> Next, the intermediate layer formation material prepared in the above step <2B> was applied onto the anode by a spin coating method, and was then dried under the conditions of 60° C.×15 minutes in a nitrogen atmosphere to thereby form an intermediate layer having an average thickness of 5 nm on the ITO electrode (anode).

<4B> Next, the intermediate layer was heated under the conditions of 50° C.×120 minutes under reduced pressure to stabilize it.

Thereafter, the intermediate layer formed on the anode was analyzed using a repeated reflection type polarizing infrared absorption spectrum method and a high resolution secondary ion mass spectrometry method (TOFSIMS method). As a result of the analysis, it was confirmed that molecules of the lithium stearate were oriented in a state that each lithium atom was positioned on the side of the intermediate layer adjacent to the anode and each heptadecyl group was positioned on the opposite side of the intermediate layer.

<5B> Next, a 2.0 wt % xylene solution of N,N'-diphenyl-N,N'-bis(3-methylphenyl)-1,1'-biphenyl-4,4'-diamine (TPD1) was applied onto the intermediate layer by a spin coating method, and was then dried to thereby form a hole transport layer having an average thickness of 50 nm on the intermediate layer.

<6B> Next, a light emitting layer was formed on the hole transport layer in the same manner as in the above step <3A>. In this regard, it is to be noted that the light emitting layer was constituted of poly(9,9-dioctyl-2,7-divinylenefluorenyl-ortho-co(anthracene-9,10-diyl) (weight average molecular weight: 200,000) and had an average thickness of 50 nm.

<7B> Next, Ca and Al were applied onto the light emitting layer by a continuous vacuum evaporation to thereby form a laminated electrode (that is, a cathode) on the light emitting layer. In this regard, it is to be noted that the laminated electrode was comprised of a layer constituted of Ca and a layer constituted of Al, and had an average thickness of 300 nm.

<8B> Next, these layers described above were sealed by a protection cover made of polycarbonate in the same manner as in the above step <8A> to obtain an organic EL device.

Example 2B

An organic EL device was obtained in the same manner as in Example 1B, except that the intermediate layer formation material was prepared by changing the lithium stearate to sodium laurate in the above step <2B>.

Example 3B

An organic EL device was obtained in the same manner as in Example 1B, except that the intermediate layer formation material was prepared by changing the lithium stearate to behenic acid in the above step <2B>.

Example 4B

An organic EL device was obtained in the same manner as in Example 1B, except that the intermediate layer formation material was prepared by changing the lithium stearate to palmityl alcohol in the above step <2B>.

Example 5B

An organic EL device was obtained in the same manner as in Example 1B, except that the intermediate layer formation material was prepared by changing the lithium stearate to isoalkyl alcohol represented by a chemical formula $C_8H_{17}(C_3H_7)CH$—OH in the above step <2B>.

Example 6B

An organic EL device was obtained in the same manner as in Example 1B, except that the intermediate layer formation material was prepared by changing the lithium stearate to lithium stearyl benzene sulfonate in the above step <2B>.

Example 7B

An organic EL device was obtained in the same manner as in Example 1B, except that the intermediate layer formation material was prepared by changing the lithium stearate to lauryl benzene sulfonic acid in the above step <2B>.

Example 8B

An organic EL device was obtained in the same manner as in Example 1B, except that a 0.1 wt % diluted acetic acid solution of oxyfluorene was used as the intermediate layer formation material instead of the intermediate layer formation material prepared in the above step <2B>.

Comparative Example 1B

An organic EL device was obtained in the same manner as in Example 1B, except that the above steps <2B> to <4B> (that is, the step of forming the intermediate layer) were omitted.

Comparative Example 2B

An organic EL device was obtained in the same manner as in Example 1B, except that an intermediate layer having an average thickness of 3 nm was formed by a vacuum evaporation of copper phthalocyanine instead of the spin coating method used in the formation of the intermediate layer in the above steps <2B> to <4B>.

2. Evaluation

The electrification current (A), the luminous brightness (cd/m$^2$), the maximum luminous efficiency (lm/W), and the time that elapsed before the luminous brightness became half of the initial value (that is, a half-life) of each of the organic EL devices obtained in the Examples and Comparative Examples mentioned above were measured.

In this regard, it is to be noted that these measurements were made by applying a voltage of 9 V between the anode and the cathode in each of the organic EL devices.

The measurement values (that is, the electrification current, the luminous brightness, the maximum luminous efficiency, and the half-life) of each of the Examples 1A to 8A were evaluated according to the following four criteria A to D, respectively, wherein the measurement values of the Comparative Example 1A were used as reference values.

A: The measurement value was 1.50 times or more that of the Comparative Example 1A.

B: The measurement value was 1.25 times or more but less than 1.50 times that of the Comparative Example 1A.

C: The measurement value was 1.00 times or more but less than 1.25 times that of the Comparative Example 1A.

D: The measurement value was 0.75 times or more but less than 1.00 times that of the Comparative Example 1A.

The evaluation results are shown in the attached Table 1.

TABLE 1

|  | Electrification Current | Luminous Brightness | Maximum Luminous Efficiency | Half-Life |
|---|---|---|---|---|
| Ex. 1A | A | A | A | A |
| Ex. 2A | A-B | A-B | A | A |
| Ex. 3A | A-B | A-B | A-B | A-B |
| Ex. 4A | A-B | A-B | B | B |
| Ex. 5A | A-B | A-B | B | B |
| Ex. 6A | A | A | A-B | A |
| Ex. 7A | A-B | A-B | A-B | B |
| Ex. 8A | B | B | B | B |
| Comp. Ex. 1A |  |  |  |  |

As shown in Table 1, all the organic EL devices of each of the Examples were superior to the organic EL devices of the Comparative Example in their electrification current, luminous brightness, maximum luminous efficiency, and half-life.

From these results, it has been apparent that in each of the organic EL devices of the present invention, the adhesion at the interface between the cathode and the intermediate layer and the adhesion at the intermediate layer and the light emitting layer were both improved, and therefore transfer of electrons from the cathode to the light emitting layer through the intermediate layer was carried out smoothly.

Further, the results showed that the organic EL device of each of the Examples 1A, 2A and 6A had more excellent maximum luminous efficiency and half-life. This is supposed to result from the reason that the work function of the cathode became lower by selecting a metal atom having a low work function as the atom M contained in the compound (1).

Next, the measurement values (that is, the electrification current, the luminous brightness, the maximum luminous efficiency, and the half-life) of each of the Examples 1B to 8B and Comparative Example 2B were evaluated according to the following four criteria A to D, respectively, wherein the measurement values of the Comparative Example 1B were used as reference values.

A: The measurement value was 1.50 times or more that of the Comparative Example 1B.

B: The measurement value was 1.25 times or more but less than 1.50 times that of the Comparative Example 1B.

C: The measurement value was 1.00 times or more but less than 1.25 times that of the Comparative Example 1B.

D: The measurement value was 0.75 times or more but less than 1.00 times that of the Comparative Example 1B.

The evaluation results are shown in the attached Table 2.

TABLE 2

|  | Electrification Current | Luminous Brightness | Maximum Luminous Efficiency | Half-Life |
|---|---|---|---|---|
| Ex. 1B | A-B | A-B | B | B |
| Ex. 2B | A-B | A-B | B | B |
| Ex. 3B | A-B | A-B | B | B |
| Ex. 4B | B | B | B | B |
| Ex. 5B | B | B | B | B |
| Ex. 6B | A-B | B | B | B |
| Ex. 7B | A-B | B | B | B |
| Ex. 8B | B-C | B-C | B | B |
| Comp. Ex. 1B |  |  |  |  |
| Comp. Ex. 2B | C | C | C | C |

As shown in Table 2, all the organic EL devices of each of the Examples were superior to the organic EL devices of each of the Comparative Examples in their electrification current, luminous brightness, maximum luminous efficiency, and half-life.

From these results, it has been apparent that in each of the organic EL devices of the present invention, the adhesion at the interface between the anode and the intermediate layer and the adhesion at the intermediate layer and the hole transport layer were both improved, and therefore transfer of holes from the anode to the hole transport layer through the intermediate layer was carried out smoothly.

INDUSTRIAL APPLICABILITY

According to the present invention, an electronic device (organic EL device) having a substrate for an electronic device includes an intermediate layer provided between an organic semiconductor layer (light emitting layer) and an inorganic layer (cathode) so as to make contact with both of them.

The intermediate layer is constituted of a compound represented by a general formula R—X—O—M as a main component thereof. Molecules of this compound are oriented along a thickness direction of the intermediate layer in a state that each nonpolar portion constituted of a hydrocarbon group R is positioned on the side of the organic semiconductor layer and each polar portion constituted of a part including an atom M is positioned on the side of the inorganic layer.

Further, the nonpolar portion and the polar portion exhibits excellent affinity for a constituent material of the organic semiconductor layer and a constituent material of the inorganic layer, respectively. Therefore, the intermediate layer has excellent adhesion to both of the organic semiconductor layer and inorganic layer at each of the contact surfaces therebetween.

As a result, since carriers can be transferred from the inorganic layer to the organic semiconductor layer through the intermediate layer smoothly, the electronic device provided with the substrate for an electronic device can exhibit high carrier transport ability.

Furthermore, use of a method for manufacturing a substrate for an electronic device in accordance with the present invention makes it possible to manufacture an electronic device provided with the substrate for an electronic device having the above structure easily and reliably.

In addition, electronic equipment provided with the electronic device having such a structure can exhibit high reliability. Therefore, the present invention has industrial applicability.

What is claimed is:

1. A substrate for an electronic device, comprising:
an organic semiconductor layer having a first surface and a second surface;
an inorganic layer containing a metal atom; and
an intermediate layer between the organic semiconductor layer and the inorganic layer so as to make contact with both the first surface of the organic semiconductor layer and the inorganic layer,
the intermediate layer being constituted of a compound, as a main, component thereof, represented by a general formula R—X—O-M, wherein R is a hydrocarbon group, X is a sulfonyl group, and M is a metal atom, the metal atom M and the metal atom contained in the inorganic layer belonging to a congener in the periodic table, and
molecules of the compound being oriented along a thickness direction of the intermediate layer in a state that the hydrocarbon group R is positioned on the side of the organic semiconductor layer and the metal atom M is positioned on the side of the inorganic layer.

2. The substrate as claimed in claim 1, wherein the hydrocarbon group R is a saturated hydrocarbon group.

3. The substrate as claimed in claim 1, wherein the number of carbon. atom(s) contained in the hydrocarbon group R is in the range of 1 to 30.

4. The substrate as claimed in claim 1, wherein the metal atom contained in the inorganic layer and the metal atom M are one of an alkali metal and an alkali earth metal.

5. The substrate as claimed in claim 1, wherein the metal atom M is Li, Na, K, Mg, Sc, Zn or Ca.

6. The substrate as claimed in claim 1, wherein a part of the compound is penetrated into the organic semiconductor layer.

7. The substrate as claimed in claim 1, wherein a part of the compound is penetrated into the inorganic layer.

8. The substrate as claimed in claim 1, wherein an average thickness of the intermediate layer is 10 nm or less.

9. The substrate as claimed in claim 1, further comprising a hole transport layer on the second surface of the organic semiconductor layer.

10. The substrate as claimed in claim 9, wherein the hole transport layer contains a conjugated compound.

11. The substrate as claimed in claim 1, wherein the compound represented by the general formula R—X—O-M is an alkyl benzene sulfonic acid metallic salt.

12. A method for manufacturing a substrate for an electronic device according to claim 1, the substrate comprising an organic semiconductor layer, an inorganic layer, and an intermediate layer between the organic semiconductor layer and the inorganic layer so as to make contact with both of the organic semiconductor layer and the inorganic layer, the method comprising:
forming the organic semiconductor layer;
preparing a liquid containing a compound represented by a general formula R—X—O-M, wherein R is a hydrocarbon group, X is a sulfonyl group, and M is a metal atom;
applying the liquid onto one surface of the organic semiconductor layer so that molecules of the compound are oriented along a thickness direction of the organic semiconductor layer in a state that the hydrocarbon group R is positioned on the side of the organic semiconductor layer and the metal atom NI is positioned on the opposite side of the organic semiconductor layer due to affinity of the hydrocarbon group R and a constituent material of the organic semiconductor layer;
drying the liquid to obtain the intermediate layer having one surface which makes contact with the organic semiconductor layer and the other surface which is opposite to the one surface; and
forming the inorganic layer so as to make contact with the other surface of the intermediate layer, the inorganic layer containing a metal atom, wherein the metal atom M and the metal atom contained the inorganic layer belong to a congener in the periodic table.

13. The method as claimed in claim 12, wherein the liquid contains a solvent or a dispersion medium in which the compound is dissolved or dispersed, the solvent or the dispersion medium being of the type that can dissolve or swell the organic semiconductor layer, and
wherein in the liquid applying step, when the liquid is applied onto the one surface of the organic semiconductor layer, a part of the compound is penetrated into the organic semiconductor layer by dissolving or swelling the vicinity of the one surface thereof.

14. An electronic device comprising the substrate as claimed in claim 1.

15. The electronic device as claimed in claim 14, wherein the electronic device is an organic electroluminescence device.

16. Electronic equipment comprising the electronic device as claimed in claim 15.

* * * * *